United States Patent [19]

Moser et al.

[11] Patent Number: 5,237,488

[45] Date of Patent: Aug. 17, 1993

[54] PORTABLE COMPUTER WITH DISPLAY UNIT CONNECTED TO SYSTEM UNIT THROUGH CONDUCTING HINGE

[75] Inventors: Gregory T. Moser, Easton, Pa.; Jane M. Shewchuck, Dearborn, Mich.

[73] Assignees: Virginia Polytechnic Institute & State University; Virginia Tech Intellectual Properties, Inc., both of Blacksburg, Va.

[21] Appl. No.: 881,431

[22] Filed: May 11, 1992

[51] Int. Cl.⁵ .................. H05K 1/16; H01R 39/12; E05D 11/00; G06F 7/16

[52] U.S. Cl. .................. 361/729; 361/681; 439/31; 16/223; 16/386

[58] Field of Search .................. 439/13, 23, 24, 31; 16/223, 386; 364/708; 361/380, 390, 392, 393, 395, 394, 399

[56] References Cited

U.S. PATENT DOCUMENTS

| | | | |
|---|---|---|---|
| 3,199,059 | 8/1965 | Masse et al. | 439/31 |
| 3,355,695 | 11/1967 | Overesch | 439/31 |
| 3,860,312 | 1/1975 | Gordon, Jr. | 439/31 |
| 4,437,716 | 3/1984 | Cooper | 439/31 |
| 4,643,508 | 2/1987 | Schaller | 439/31 |
| 4,673,228 | 6/1987 | Ditzig | 439/13 X |
| 4,870,311 | 9/1989 | Chase et al. | 439/13 X |
| 4,904,189 | 2/1990 | Hallings | 439/13 |
| 5,001,659 | 3/1991 | Watabe | 364/708 |

FOREIGN PATENT DOCUMENTS 73903 3/1983 European Pat. Off. .............. 439/13

OTHER PUBLICATIONS

IBM Technical Disclosure Bulletin, vol. 12, No. 3, Aug., 1969, "Electrically Conductive Hinge", p. 446, J. L. Steenburgh.
IBM Technical Disclosure Bulletin, vol. 34, No. 9, Feb., 1992, pp. 29-32.

Primary Examiner—Leo P. Picard
Assistant Examiner—Michael W. Phillips
Attorney, Agent, or Firm—Whitham & Marhoefer

[57] ABSTRACT

An electrically conductive hinge provides for the transmission of electrical power and signals between a pivotally connected display unit and system unit of a portable computer and eliminates cable connections between the display unit and the system unit. Either the system unit, the display unit, or both units have a set of wipers which contact the conductive lines in the electrical track. The conductive lines are long enough to allow the display unit to be pivoted to and from its open and shut positions while the wipers remain in contact therewith. In one arrangement, the electrical track is manufactured on the hinge pin. In another arrangement, the electrical track is manufactured on a disk positioned at or near one end of the hinge pin.

2 Claims, 3 Drawing Sheets

PORTABLE COMPUTER WITH DISPLAY UNIT CONNECTED TO SYSTEM UNIT THROUGH CONDUCTING HINGE

BACKGROUND OF THE INVENTION

1. Field of the Invention

The present invention is generally related to portable computers such as lap-top and notebook style computers. More particularly, the invention is related to a hinge which connects the system unit and the display unit of the portable computer and eliminates the need for wire connections between the system unit and the display unit.

2. Description of the Prior Art

Portable computers, such as lap-top and notebook style computers, have recently gained wide spread popularity. Examples of such computers are commercially available from such sources as Zenith, Toshiba, IBM, Compaq, as well as a wide variety of other manufacturers. Lap-top and notebook style computers are characterized as having a system unit which houses the disk drives, memory, and computer hardware, and a display unit which is hingedly connected to the system unit. During use, the display unit is pivoted open on the hinge and a keyboard connected to the system unit is used to interact with information displayed on the display unit. After use, the display unit is pivoted closed, usually against the keyboard portion of the system unit, and locked so that the computer can be conveniently carried.

Since the trend in portable computers is towards smaller sizes, the method for electrically wiring the display unit to the system unit has become a critical factor to computer performance. In prior art portable computers, wires or ribbon cables have been routed through openings in the hinge connecting the display unit to the system unit or have been left to hang freely between the display unit and the system unit. These arrangements, however, are not satisfactory for handling the design constraints of very small portable computers. Specifically, a freely hanging wire or ribbon cable tends to get pinched upon closure of the display unit. After a short period of use, new wire cabling will be required because repetitive pinching action will deteriorate the integrity of the wire connection. In addition, in very small computers, routing wires through the small hinges connecting the system unit and display unit will become an arduous task.

SUMMARY OF THE INVENTION

It is therefore an object of the present to invention to provide an electrically conductive hinge which will provide for the transmission of electrical power and signals between a pivotally connected display unit and system unit of a portable computer.

According to the invention, an electrical track is fabricated in the hinge connecting the system unit and the display unit of a portable computer. Either the system unit, the display unit, or both units have a set of wipers which contact the conductive lines in the electrical track. The conductive lines are long enough to allow the display unit to be pivoted to and from its open and shut positions while the brushes remain in contact therewith. In one arrangement, the electrical track is manufactured on the hinge pin. In another arrangement, the electrical track is manufactured on a disk positioned at or near one end of the hinge pin.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
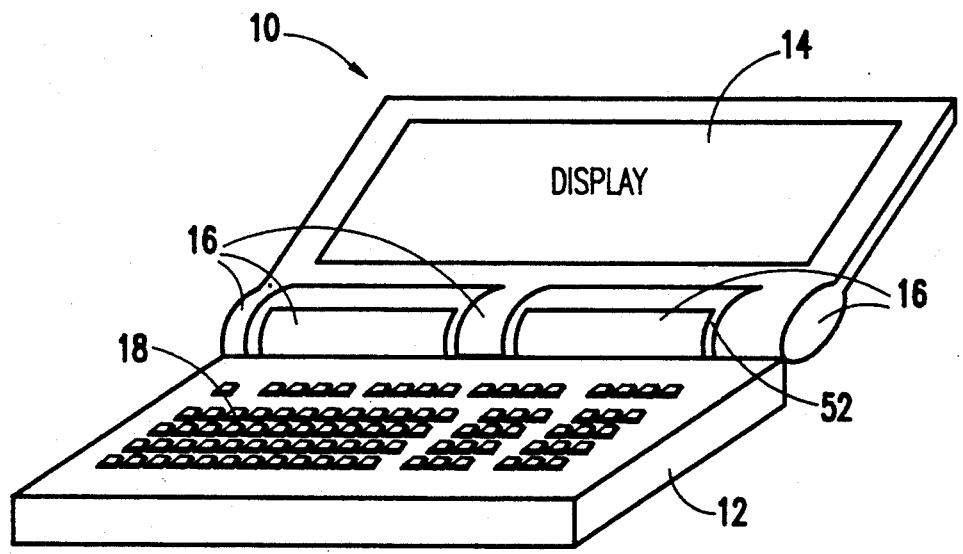
FIG. 1 is a portable computer in an open configuration.

Referring now to the drawings, and more particularly to FIG. 1, there is shown a typical portable, laptop computer, generally referred to by reference numeral 10. The computer 10 comprises a system unit 12 which houses the disk drives, memory, and other computer hardware (not shown), and a display unit 14 which is connected to the system unit 12 by hinge 16. The display unit 14 is shown in the in-use position wherein it is pivoted open on the hinge 16 and a keyboard 18 connected to the system unit 12 is used to interact with information displayed on the display unit 10. After use, the display unit 14 is pivoted to a closed position, usually against the keyboard portion 18 of the system unit, and locked so that the computer can be conveniently carried.

Figure 2A:
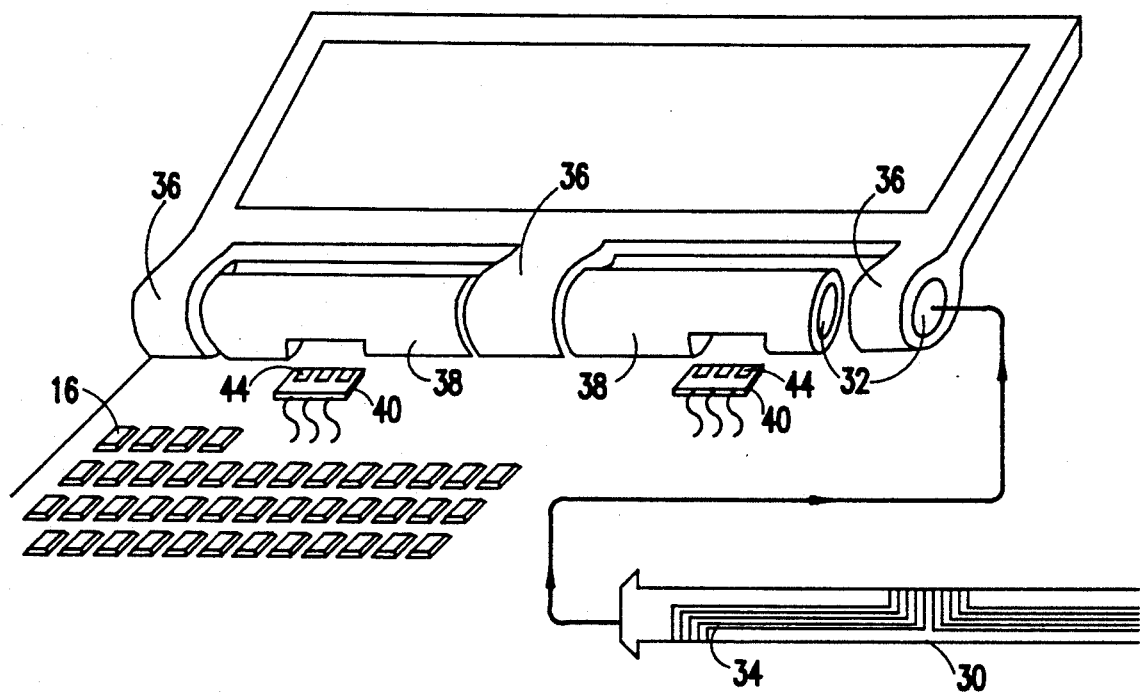
FIGS. 2a and 2b are isometric views of a first embodiment of a hinge assembly within the practice of this invention.
Figure 2B:
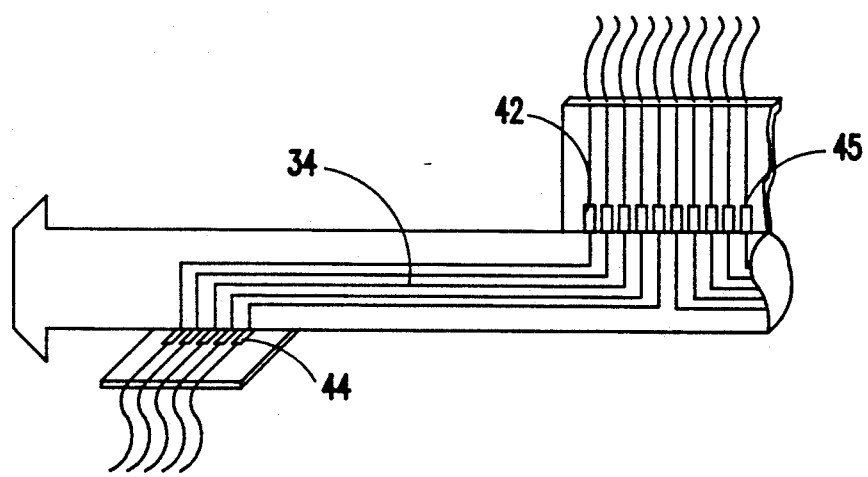

FIG. 2a shows a first embodiment of the conductive hinge assembly. A hinge pin 30 is inserted through a hinge bore 32 to connect the system unit 12 and the display unit 14 of the portable computer 10. Electrically conductive tracks 34 are located on the surface of the hinge pin 30. The conductive tracks 34 are generally concealed and protected from dust and dirt by the display unit hinge members 36 and the system unit hinge members 38. Electrical connectors 40 fitted with contacting wipers 44 extend from the system unit 12 into hinge bore 32 and make electrical contact with the conductive tracks 34. Likewise, as is best shown in FIG. 2b, electrical connector 42 fitted with wiper 45 extends from the display unit 14 into hinge bore 32 and make electrical contact with the conductive tracks 34. The conductive tracks 34 are long enough to allow the display unit to be pivoted to and from its open and shut positions while the wipers 44 and 45 remain in electrical contact therewith. The conductive tracks 34 provide a wireless electrical path for supplying power and video signals from the system unit 12 to the display unit 14.

Figure 3:
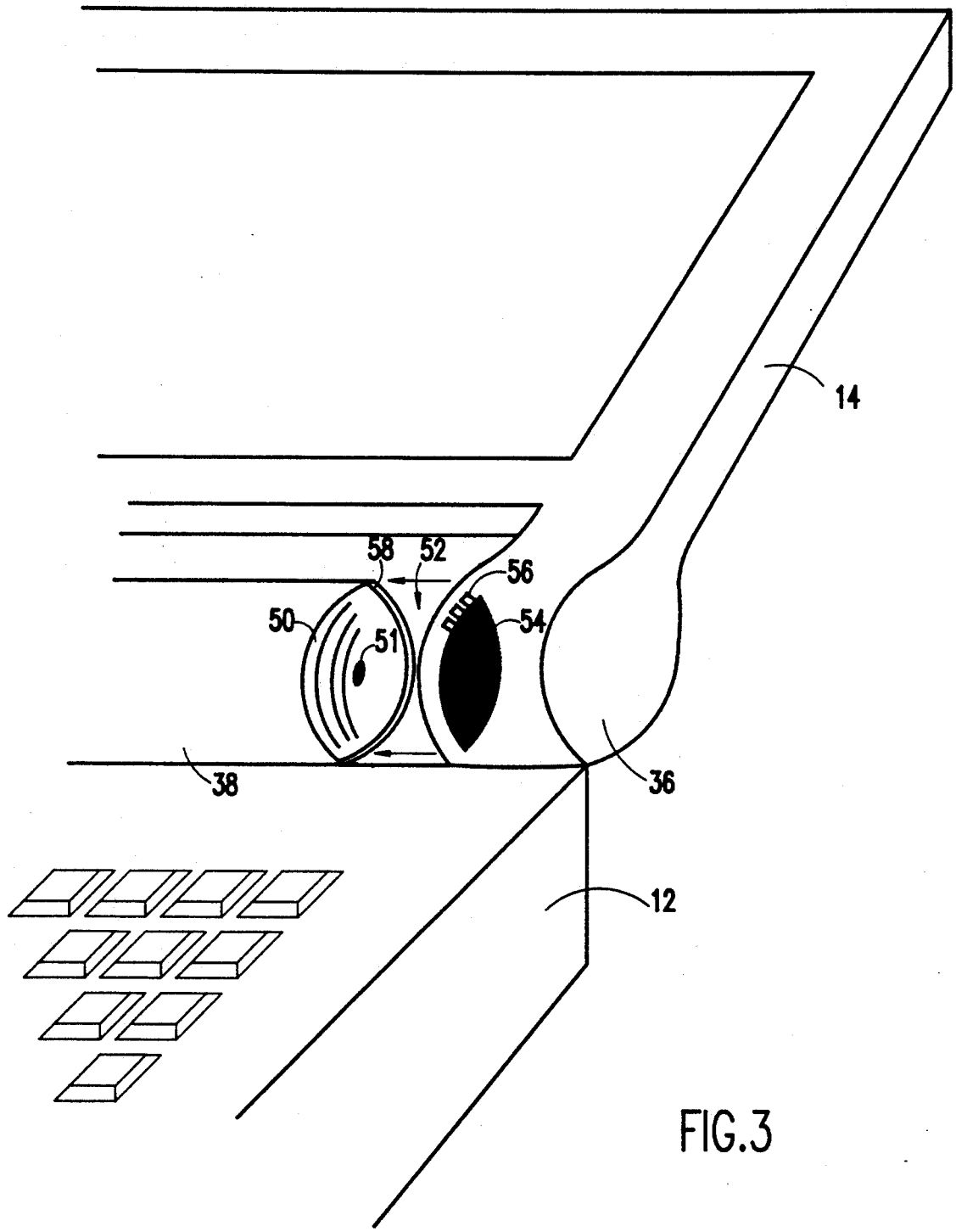
FIG. 3 is an isometric view of a second embodiment of a hinge assembly within the practice of this invention.

FIG. 3 shows a second embodiment of the conductive hinge assembly wherein electrically conductive tracks 50 are concentrically arranged in arcuate lines about a hinge bore 51 at or near a joint 52 between a display unit hinge member 36 and system unit hinge member 38 and are parallel to a plane travelled by said display 14 when pivoting between its open and closed positions. Electrically conductive wipers 56 corresponding to the conductive tracks are mounted to a disk assembly 54. The conductive tracks 50 and the wipers 56 are electrically connected to circuitry in the system unit 12 and display 14, respectively. The conductive tracks 50 are long enough to allow the wipers 56 to remain in contact for the full pivot of the display 14 relative to the system unit 12. The disk assembly is sized to fit within a lip 58 which extends beyond the system unit hinge member 38. The lip 58 helps to shield the conductive tracks 50 from dust and dirt. The disk assembly 54 rotates with the display unit 14 as it is pivoted to and from its open and shut positions. Hence, the wipers 56 rotate with the disk 54 and remain in electrical contact with the conductive tracks 50 to provide a wireless electrical path for supplying power and video signals from the system unit 12 to the display unit 14. Obviously, the arrangement of FIG. 3 could be reversed with the wiper 56 being connected to the system unit 12 and the electrical track 50 being connected to the display 14.

In both embodiments, the electrical tracks could be made by standard printing and patterning procedures well known in the electronics industry, and could be fabricated from copper, aluminum, copper-aluminum alloys, or other suitable metallization. Likewise, wiper assemblies are also well known in the electronics industry and should be chosen to maintain good electrical contact with the track without causing severe mechanical degradation.

While the invention has been described in terms of its preferred embodiments, those skilled in the art will recognize that the invention can be practiced with modification within the spirit and scope of the appended claims.

Having thus described our invention, what we claim as new and desire to secure by Letters Patent is as follows:

1. A portable computer, comprising:
   a system unit;
   a display unit;
   a hinge connecting the system unit to the display unit, said hinge permitting said display unit to be pivotted between a closed position and an open position relative to said system unit;
   a plurality of electrical tracks formed on a member positioned in said hinge;
   at least one contact assembly connected to either said system unit or said display unit which has a plurality of contacting wipers for contacting said plurality of electrical tracks, said electrical tracks and said contact assembly establishing electrical communication for transmitting electrical power and signals between said system unit and said display unit.

2. A portable computer as recited in claim 1 wherein said member is a hinge pin positioned in said hinge, said electrical tracks being formed on an exterior surface of said hinge pin.

* * * * *